United States Patent
Yang et al.

(10) Patent No.: US 8,912,530 B2
(45) Date of Patent: Dec. 16, 2014

(54) ELECTRODE STRUCTURE INCLUDING GRAPHENE AND FIELD EFFECT TRANSISTOR HAVING THE SAME

(75) Inventors: Hee-jun Yang, Seoul (KR); Seong-jun Park, Seoul (KR); Hyun-jong Chung, Hwaseong-si (KR); Jin-seong Heo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 14 days.

(21) Appl. No.: 13/431,031

(22) Filed: Mar. 27, 2012

(65) Prior Publication Data

US 2013/0075700 A1 Mar. 28, 2013

(30) Foreign Application Priority Data

Sep. 22, 2011 (KR) .......................... 10-2011-0095813

(51) Int. Cl.
| | | |
|---|---|---|
| *H01L 29/06* | (2006.01) | |
| *H01L 31/00* | (2006.01) | |
| *H01L 29/45* | (2006.01) | |
| *H01L 29/78* | (2006.01) | |
| *H01L 29/16* | (2006.01) | |
| *H01L 29/417* | (2006.01) | |

(52) U.S. Cl.
CPC ............ *H01L 29/456* (2013.01); *H01L 29/452* (2013.01); *H01L 29/78* (2013.01); *H01L 29/1606* (2013.01); *H01L 29/41725* (2013.01); *H01L 29/45* (2013.01)
USPC .......................................................... 257/27

(58) Field of Classification Search
USPC ................... 257/27, 213–413, 900, 902, 903, 257/E21.19–E21.21, E21.394–E21.458, 257/E21.615–E21.694; 438/135, 142
See application file for complete search history.

(56) References Cited

U.S. PATENT DOCUMENTS

| | | | |
|---|---|---|---|
| 7,736,542 B2 | 6/2010 | Shibata et al. | |
| 2009/0286362 A1* | 11/2009 | Jiang et al. | ..................... 438/151 |
| 2010/0132773 A1 | 6/2010 | Lagally et al. | |
| 2010/0258787 A1* | 10/2010 | Chae et al. | ....................... 257/39 |
| 2011/0127471 A1 | 6/2011 | Shin et al. | |
| 2011/0227044 A1 | 9/2011 | Kawanaka et al. | |
| 2011/0253980 A1 | 10/2011 | Chang et al. | |
| 2012/0031477 A1 | 2/2012 | Fogel et al. | |
| 2012/0049160 A1 | 3/2012 | Sano et al. | |
| 2012/0056161 A1* | 3/2012 | Avouris et al. | ................... 257/24 |

FOREIGN PATENT DOCUMENTS

| | | |
|---|---|---|
| GB | 1223704 A | 3/1971 |
| JP | 8306964 A | 11/1996 |
| KR | 20090123951 A | 12/2009 |
| KR | 20100086464 A | 7/2010 |
| KR | 0992483 B1 | 8/2010 |
| KR | 2011-0032999 A | 3/2011 |
| KR | 2011-0049673 A | 5/2011 |
| KR | 2011-0061909 A | 6/2011 |
| KR | 2011-0118408 A | 10/2011 |
| WO | WO-2010/025938 A1 | 3/2010 |
| WO | WO-2011/113518 A1 | 7/2010 |

* cited by examiner

*Primary Examiner* — Dao H Nguyen
*Assistant Examiner* — Tram H Nguyen
(74) *Attorney, Agent, or Firm* — Harness, Dickey & Pierce, P.L.C.

(57) ABSTRACT

According to example embodiments, an electrode structure includes a graphene layer on a semiconductor layer and an electrode containing metal on the graphene layer. A field effect transistor (FET) may include the electrode structure.

25 Claims, 2 Drawing Sheets

ELECTRODE STRUCTURE INCLUDING GRAPHENE AND FIELD EFFECT TRANSISTOR HAVING THE SAME

CROSS-REFERENCE TO RELATED APPLICATIONS

This application claims priority under 35 U.S.C. §119 to Korean Patent Application No. 10-2011-0095813, filed on Sep. 22, 2011, in the Korean Intellectual Property Office, the entire contents of which are incorporated herein by reference.

BACKGROUND

1. Field

Example embodiments relate to an electrode structure including graphene and to a semiconductor device including the electrode structure.

2. Description of the Related Art

Graphene having a 2-dimensional hexagonal carbon structure has been actively developed throughout the world. Graphene is being studied as a material for replacing semiconductors. In particular, when graphene that is a zero gap semiconductor is manufactured as a graphene nanoribbon (GNR) having a channel width of not more than 10 nm, a bandgap is formed due to a size effect so that a field effect transistor (FET) capable of operating at room temperature may be manufactured.

In a semiconductor device, when an electrode is formed by using a metal directly on a semiconductor layer, a structure in which the metal is coupled with the semiconductor is formed. In such a structure of the semiconductor device, a Schottky energy barrier may be formed between the metal and the semiconductor, thereby resulting in an increase in a driving voltage of the semiconductor device. When a size of the semiconductor device is decreased, for example to less than about 30 nm, a ratio of a contact resistance to the entire resistance increases.

In a conventional semiconductor device, various methods such as doping of a semiconductor interface, controlling a work function of a heterojunction, and forming a silicide may be used to decrease a contact resistance.

SUMMARY

Example embodiments relate to an electrode structure including a graphene and/or a field effect transistor (FET) including the electrode structure.

Additional aspects will be set forth in part in the description which follows and, in part, will be apparent from the description, or may be learned by practice of example embodiments.

According to example embodiments, an electrode structure includes a graphene layer on a semiconductor layer, and an electrode containing metal on the graphene layer. The graphene layer may contact at least one of the semiconductor layer and the electrode containing metal.

The semiconductor layer may include one of silicon, germanium, silicon-germanium, a group III-V semiconductor, and a group II-VI semiconductor.

The graphene may be one of a single-layered structure and a bi-layered structure.

The electrode metal may have a size of less than 30 nm.

The graphene may contact the semiconductor layer, and the electrode containing metal may contact the graphene.

The semiconductor layer may include an impurity, and the graphene layer may be configured to reduce a Schottky energy barrier between the substrate and the electrode containing metal, based on the impurity of the semiconductor layer changing a work function of the graphene layer.

The impurity of the semiconductor layer may be an n-type impurity.

The impurity of the semiconductor layer may be a p-type impurity.

The graphene layer may contact the electrode containing metal. A Fermi level of the graphene layer may equal a Fermi level of the electrode containing metal.

The electrode containing metal may include one of aluminium, gold, silver, and palladium.

According to example embodiments, a field effect transistor (FET) includes a semiconductor substrate doped with a first impurity, the semiconductor substrate including a source region and a drain region doped with a second impurity having an opposite polarity to a polarity of the first impurity, a first graphene layer and a second graphene layer on the semiconductor substrate and spaced apart from each other, a source electrode containing metal and a drain electrode containing metal that are respectively on the first graphene layer and the second graphene layer, a gate insulating layer between the source electrode and the drain electrode on the semiconductor layer, and a gate electrode on the gate insulating layer. The first graphene layer is on the source region of the semiconductor substrate and the second graphene layer is on the drain region of the semiconductor substrate. The first graphene layer contacts at least one of the substrate and the source electrode. The second graphene layer contacts at least one of the substrate and the drain electrode.

The semiconductor substrate may include one of silicon, silicon-germanium, a group III-V semiconductor, and a group II-VI semiconductor.

At least one of the first graphene layer and the second graphene layer may be one of a single-layered structure and a bi-layered structure.

The source electrode and the drain electrode each may have a size of greater than 0 nm and less than 30 nm.

The first graphene and the second graphene layers may contact the semiconductor layer. The source electrode may contact the first graphene layer and the drain electrode may contact the second graphene layer.

The first graphene layer may be configured to change a Schottky energy barrier between the substrate and the source electrode.

The second impurity may be an n-type impurity.

The second graphene layer may be configured to change a Schottky energy barrier between the substrate and the drain electrode.

The first graphene and the second graphene layers may contact the source and drain electrodes, respectively. A Fermi level of the first graphene and a Fermi level of the second graphene layers, respectively, may equal a Fermi level of the source electrode containing metal and a Fermi level of the drain electrode containing metal, respectively.

According to example embodiments, a contact includes a graphene layer sandwiched between an electrode containing metal and a doped-semiconductor structure. The graphene layer is configured to change a Schottky energy barrier between the electrode containing metal and the doped-semiconductor structure.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
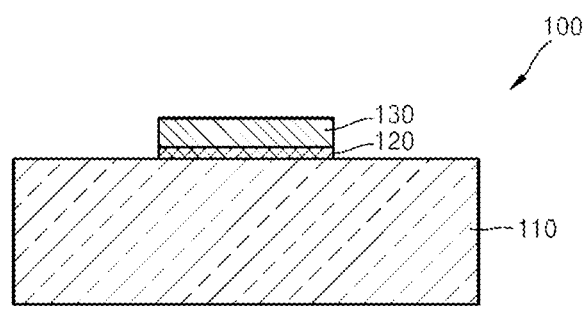
FIG. 1 is a cross-sectional view of an electrode structure including graphene according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of an electrode structure 100 including graphene according to example embodiments.

Referring to FIG. 1, a graphene 120 is formed on a semiconductor substrate 110, and an electrode metal 130 is formed on the graphene 120. The graphene 120 contacts the semiconductor substrate 110. The electrode metal 130 may be formed to have a size of less than 30 nm and greater than 0 nm. For example, the electrode metal 130 may be formed to have a size of about 1 nm to about 30 nm, or a size of about 5 nm to about 25 nm, or a size of about 10 nm to about 20 nm, but example embodiments are not limited thereto. That is, when the electrode metal 130 has a tetragonal shape, a long side thereof may be less than 30 nm, and when the electrode metal 130 has a circular shape, a diameter thereof may be less than 30 nm.

The semiconductor substrate 110 may be formed of silicon, germanium, silicon-germanium, a group III-V semiconductor, a group II-VI semiconductor, etc.

The graphene 120 may be formed by transferring graphene manufactured through chemical vapor deposition (CVD) on the semiconductor substrate 110 and then patterning the graphene. Also, graphene that is previously patterned may be disposed on the semiconductor substrate 110. However, example embodiments are not limited thereto.

The graphene 120 may be a layer, for example a graphene sheet, a carbon nanoribbon, a carbon nanomesh (e.g., a carbon nanoribbon with patterned holes), but example embodiments are not limited thereto.

The graphene 120 may be a single-layered structure or a bi-layered structure. The graphene 120 is a material having a semi-metallic property. When the graphene 120 has a multi-layered (more than three layers) structure, the semi-metallic property of the graphene 120 may be decreased. For example, the graphene may include a thickness of 1 or 2 carbon atoms, but example embodiments are not limited thereto.

The electrode metal 130 formed on the graphene 120 may be formed of a general electrode material. For example, the electrode metal 130 may be formed of aluminum, gold, silver, palladium, etc. The electrode metal 130 may be deposited to cover the graphene 120 formed on the semiconductor substrate 110 by electron beam evaporation or sputtering.

In the electrode structure 100 having a structure including graphene and an electrode metal of a small size, e.g. nanoscale size, a contact resistance is decreased, and thus an electrode area may be formed to be small. Accordingly, the electrode structure 100 may be widely used in an electronic device, a semiconductor device, and the like.

Hereinafter, an electrode structure 100 according to example embodiments will be described with reference to FIGS. 2 and 3.

Figure 2:
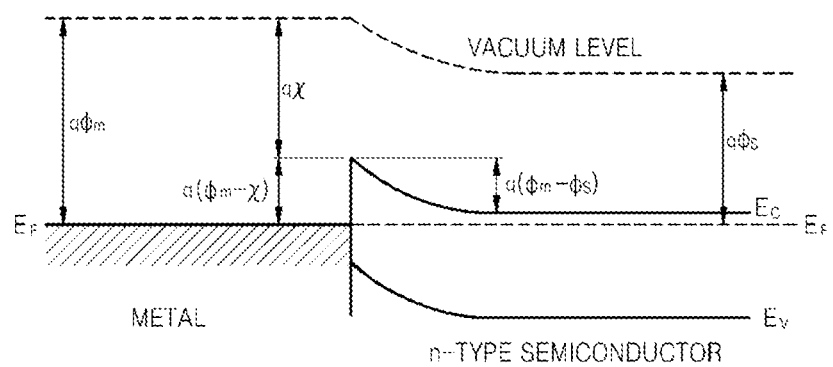
FIG. 2 is a general energy band diagram illustrating an energy barrier between a metal and a semiconductor.

FIG. 2 is a general energy band diagram illustrating an energy barrier between a metal and a semiconductor. FIG. 2 is an energy band diagram of an electrode structure in which an electrode metal is formed on an n-type semiconductor substrate.

Referring to FIG. 2, in order for an electron to move from an electrode metal to a semiconductor layer, the electron should overcome a Schottky energy barrier $q(\phi_m-X)$. Similarly, in order for an electron in a conduction band of an n-type semiconductor to move toward the electrode metal, the electron requires energy of $q(\phi_m-\phi_s)$, wherein $q\phi_m$ denotes a work function of an electrode metal, X denotes electron affinity, and $q\phi_s$ denotes a work function of a semiconductor.

Figure 3:
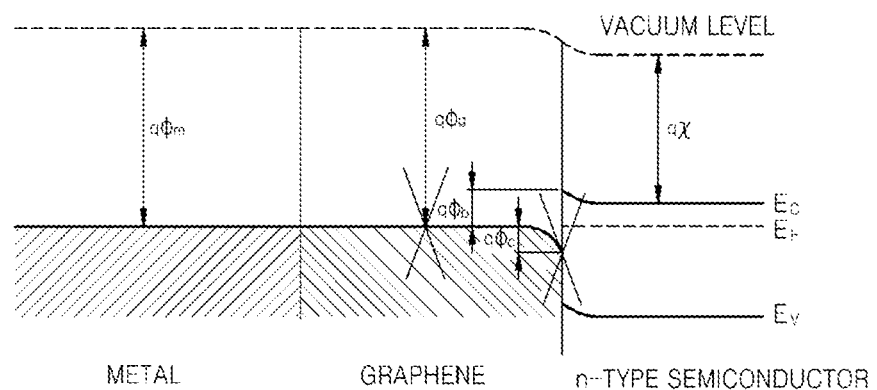
FIG. 3 is an energy band diagram illustrating an energy barrier of an electrode structure, according to example embodiments.

FIG. 3 is an energy band diagram illustrating an energy barrier of an electrode structure, according to example embodiments. FIG. 3 is an energy band diagram of an electrode structure in which graphene and an electrode metal are sequentially formed on an n-type semiconductor. In FIG. 3, $E_F$ refers to the Fermi level, $E_C$ refers to the conduction band energy, and $E_V$ refers to the valence band energy.

Referring to FIG. 3, the graphene has no band gap, and thus there is no change in a Fermi level between the electrode metal and the graphene. However, in a graphene-semiconductor junction, the graphene receives electrons from an n-type semiconductor and thus a work function of the graphene changes in a direction in which an energy barrier of a Fermi level decreases. That is, the graphene is n-doped. After the graphene is bonded to the n-type semiconductor, the work function of the graphene is decreased by $q\phi_d$, and consequently, a Schottky energy barrier is decreased due to a characteristic of the graphene having an intermediate property between a semiconductor and an electrode metal. This phenomenon may be applied to any structure in which a semiconductor is coupled with a metal.

In order for an electron to move from an electrode metal to a semiconductor layer, the electron should overcome a Schottky energy barrier of $q\phi_b=q(\phi_m-\phi_d-x)$. Compared to a conventional electrode having a metal-semiconductor structure, according to example embodiments, energy is decreased by $q\phi_d$. Similarly, in order for an electron in a conduction band of an n-type semiconductor to move toward the electrode metal, the electron requires energy of $q(\phi_m-\phi_s-\phi_d)$. Thus, according to example embodiments, energy is decreased by $q\phi_d$, compared to a conventional electrode having a metal-semiconductor structure, wherein $q\phi_g$ denotes graphene.

In FIG. 3, an energy barrier of an electron has been described using an n-type semiconductor. However, in a case where a p-type semiconductor is used and a hole is used as a carrier, an energy barrier is decreased by $q\phi_d$ between a semiconductor and an electrode due to the interposition of graphene, and a detailed description thereof will be omitted here.

Figure 4:
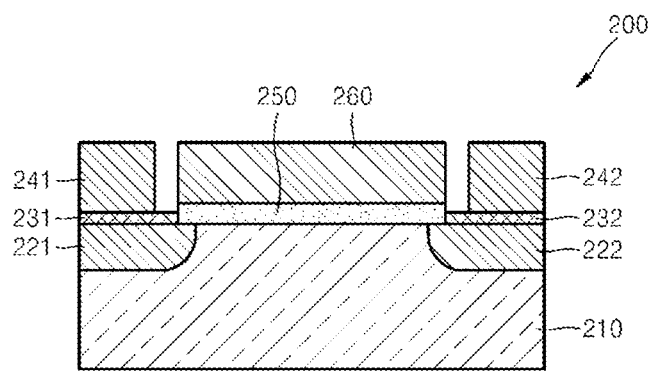
FIG. 4 is a cross-sectional view of a field effect transistor (FET) according to example embodiments.

FIG. 4 is a cross-sectional view of a field effect transistor (FET) 200 according to example embodiments.

Referring to FIG. 4, a semiconductor substrate 210 doped with a first impurity is formed, and a source region 221 and a drain region 222 that are doped with a second impurity having an opposite polarity to the first impurity are formed. The source region 221 and the drain region 222 are formed on the semiconductor substrate 210 so as to be spaced apart from each other. The first and second impurities may be different types of impurities, for example, p-type and n-type impurities.

The semiconductor substrate 210 may be formed of silicon, germanium, silicon-germanium, a group III-V semiconductor, a group II-VI semiconductor, etc.

An insulating layer (not shown) is formed on the semiconductor substrate 210. The insulating layer may be formed of silicon oxide or silicon nitride. A portion of the insulating layer corresponding to the source and drain regions 221 and 222, is removed from the semiconductor substrate 210 to form an insulating layer 250, thereby exposing the source region 221 and the drain region 222.

A first graphene 231 and a second graphene 232 are respectively disposed directly on the source region 221 and the drain region 222 that are exposed. Thus, the first graphene 231 and the second graphene 232 contact the semiconductor substrate 210. The first graphene 231 and the second graphene 232 may be graphene having a single-layered structure or a bi-layered structure. For example, the first graphene 231 and the second graphene 232 may each have a thickness of 1 or 2 carbon atoms, but example embodiments are not limited thereto. The first graphene 231 and the second graphene 232 may be formed by transferring graphene manufactured by CVD. The first graphene 231 and the second graphene 232 may be formed by transferring graphene (not shown) onto the semiconductor substrate 210 and then patterning the graphene. Alternately, graphene that is previously patterned may be disposed on the semiconductor substrate 210.

A source electrode 241 and a drain electrode 242 are respectively formed on the first graphene 231 and the second graphene 232. The source electrode 241 and the drain electrode 242 may be formed of a general electrode metal, for example, aluminum, gold, platinum, silver, or palladium. The source electrode 241 and the drain electrode 242 may be formed on the first graphene 231 and the second graphene 232, respectively, by electron beam evaporation or sputtering. The source electrode 241 and the drain electrode 242 may be formed to have a size of less than 30 nm. That is, when the source electrode 241 and the drain electrode 242 each has a tetragonal shape, a long side thereof may be less than 30 nm, and when the source electrode 241 and the drain electrode 242 each has a circular shape, a diameter thereof may be less than 30 nm.

The insulating layer 250 formed between the source electrode 241 and the drain electrode 242 may be referred to as a gate insulating layer 250. A gate electrode 260 is formed on the gate insulating layer 250. The gate electrode 260 may be formed of a material that is the same as that used to form the source electrode 241 and the drain electrode 242.

In a FET according to example embodiments, graphene is formed on a substrate, and an electrode metal is formed thereon so that the graphene is disposed between the substrate formed of a semiconductor and the electrode metal, thereby decreasing an energy barrier of an electrode structure. The operation of an electrode structure according to example embodiments has been described above, and thus a detailed description thereof will be omitted here.

In the FET employing the electrode structure, a driving voltage may be decreased due to a reduction in a contact resistance, and also a size of an electrode region may be reduced due to the reduction in the contact resistance thereof, and thus the FET may be made small.

While a FET including a graphene electrode structure according to example embodiments has been described, example embodiments are not limited thereto. For example, the graphene electrode structure according to example embodiments may be applied to other semiconductors device using a semiconductor substrate and including an electrode structure that includes graphene contacting the semiconductor substrate.

While some example embodiments have been particularly shown and described, it will be understood by one of ordinary skill in the art that variations in form and detail may be made therein without departing from the spirit and scope of the claims. Descriptions of features or aspects within electrode structures and/or FETs according to example embodiments should typically be considered as available for other similar features or aspects in other electrodes and/or FETs according example embodiments.

What is claimed is:

1. An electrode structure comprising:
a graphene layer on a semiconductor layer; and
an electrode containing metal directly on the graphene layer,
the graphene layer having no band gap, and
the graphene layer being between the semiconductor layer and an entire surface of the electrode containing metal facing the semiconductor layer so the electrode containing metal does not directly contact the semiconductor layer.

2. The electrode structure of claim 1, wherein the semiconductor layer includes one of silicon, germanium, silicon-germanium, a group III-V semiconductor, and a group II-VI semiconductor.

3. The electrode structure of claim 1, wherein the graphene layer is one of a single-layered structure and a bi-layered structure.

4. The electrode structure of claim 1, wherein the electrode containing metal has a size of greater than 0 nm and less than 30 nm.

5. The electrode structure of claim 1, wherein
the semiconductor layer includes an impurity,
the graphene layer is configured to change a Schottky energy barrier between the semiconductor layer and the electrode containing metal, based on the impurity of the semiconductor layer changing a work function of the graphene layer.

6. The electrode structure of claim 5, wherein the impurity of the semiconductor layer is an n-type impurity.

7. The electrode structure of claim 5, wherein the impurity of the semiconductor layer is a p-type impurity.

8. The electrode structure of claim 1, wherein
a Fermi level of the graphene layer equals a Fermi level of the electrode containing metal.

9. The electrode structure of claim 1, wherein
the electrode containing metal includes one of aluminum, gold, silver, and palladium.

10. A field effect transistor (FET) comprising:
a semiconductor substrate doped with a first impurity,
the semiconductor substrate including a source region and a drain region doped with a second impurity,
the second impurity having an opposite polarity to a polarity of the first impurity;
a first graphene layer and a second graphene layer on the semiconductor substrate and spaced apart from each other,
the first graphene layer on the source region and the second graphene layer on the drain region of the substrate;
a source electrode containing metal and a drain electrode containing metal that are respectively on the first graphene layer and the second graphene layer,
the first graphene layer contacting at least one of the substrate and the source electrode,
the second graphene layer contacting at least one of the substrate and the drain electrode;
a gate insulating layer between the source electrode and the drain electrode on the semiconductor layer; and
a gate electrode on the gate insulating layer.

11. The FET of claim 10, wherein the semiconductor substrate includes one of silicon, germanium, silicon-germanium, a group III-V semiconductor, and a group II-VI semiconductor.

12. The FET of claim 10, wherein at least one of the first graphene layer and the second graphene layer is one of a single-layered structure and a bi-layered structure.

13. The FET of claim 10, wherein the source electrode and the drain electrode each have a size of greater than 0 nm and less than 30 nm.

14. The FET of claim 10, wherein
the first graphene layer and the second graphene layer contact the semiconductor layer,
the source electrode contacts the first graphene layer, and
the drain electrode contacts the second graphene layer.

15. The FET of claim 10, wherein the first graphene layer is configured to change a Schottky energy barrier between the semiconductor substrate and the source electrode.

16. The FET of claim 15, wherein the second impurity is an n-type impurity.

17. The FET of claim 10, wherein the second graphene layer is configured to change a Schottky energy barrier between the semiconductor substrate and the drain electrode.

18. The FET of claim 10, wherein
the first graphene layer and the second graphene layers contact the source and drain electrodes, respectively; and
a Fermi level of the first graphene layer and a Fermi level of the second graphene layer, respectively, equal a Fermi level of the source electrode containing metal and a Fermi level of the drain electrode containing metal, respectively.

19. A contact comprising:
a graphene layer sandwiched between a doped-semiconductor structure and an entire surface of an electrode containing metal facing the doped-semiconductor structure, the graphene layer being configured to change a Schottky energy barrier between the doped-semiconductor structure and the electrode containing metal, and
the graphene layer having no band gap.

20. The electrode structure of claim 1, wherein one of a long side and a diameter of the electrode containing metal is greater than 0 nm and less than 30 nm.

21. The contact of claim 19, wherein one of a long side and a diameter of the electrode containing metal is greater than 0 nm and less than 30 nm.

22. The electrode structure of claim 1, wherein a width of the graphene layer is substantially equal to a width of the electrode containing metal.

23. The contact of claim 19, wherein a width of the graphene layer is substantially equal to a width of the electrode containing metal.

24. The electrode structure of claim 1, wherein the graphene layer is directly connected to the semiconductor layer.

25. The contact of claim 19, wherein the graphene layer is directly connected to the doped-semiconductor structure.

* * * * *